(12) United States Patent
Vinet et al.

(10) Patent No.: US 9,437,475 B2
(45) Date of Patent: Sep. 6, 2016

(54) METHOD FOR FABRICATING MICROELECTRONIC DEVICES WITH ISOLATION TRENCHES PARTIALLY FORMED UNDER ACTIVE REGIONS

(71) Applicant: Commissariat a l'energie atomique et aux energies alternatives, Paris (FR)

(72) Inventors: Maud Vinet, Rives sur Fure (FR); Sylvie Mignot, Slingerlands, NY (US); Romain Wacquez, Marseilles (FR)

(73) Assignee: COMMISSARIAT A L'ENERGIE ATOMIQUE ET AUX ENERGIES ALTERNATIVES, Paris (FR)

( * ) Notice: Subject to any disclaimer, the term of this patent is extended or adjusted under 35 U.S.C. 154(b) by 0 days.

(21) Appl. No.: 14/441,354

(22) PCT Filed: Nov. 8, 2012

(86) PCT No.: PCT/US2012/064110
§ 371 (c)(1),
(2) Date: May 7, 2015

(87) PCT Pub. No.: WO2014/074096
PCT Pub. Date: May 15, 2014

(65) Prior Publication Data
US 2015/0294904 A1    Oct. 15, 2015

(51) Int. Cl.
*H01L 21/762* (2006.01)
*H01L 21/84* (2006.01)
*H01L 21/311* (2006.01)
*H01L 29/06* (2006.01)

(52) U.S. Cl.
CPC ....... *H01L 21/76283* (2013.01); *H01L 21/311* (2013.01); *H01L 21/76232* (2013.01); *H01L 21/84* (2013.01); *H01L 29/0649* (2013.01)

(58) Field of Classification Search
CPC ........... H01L 21/76283; H01L 21/311; H01L 29/0649; H01L 21/76232; H01L 21/84
See application file for complete search history.

(56) References Cited

U.S. PATENT DOCUMENTS

| 6,180,490 B1 | 1/2001 | Vassiliev et al. |
| 6,780,731 B1 | 8/2004 | Tu et al. |
| 7,842,559 B2 | 11/2010 | Jakschik et al. |

(Continued)

OTHER PUBLICATIONS

International Search Report Issued Jan. 22, 2013 in PCT/US12/064110 Filed Nov. 8, 2012.

(Continued)

*Primary Examiner* — John P Dulka
(74) *Attorney, Agent, or Firm* — Oblon, McClelland, Maier & Neustadt, L.L.P.

(57) ABSTRACT

A method of producing a microelectronic device in a substrate including a first semiconductor layer, a first dielectric layer, and a second semiconductor layer, including: etching a trench through the first semiconductor layer, the first dielectric layer, and a part of the second semiconductor layer, defining one active region, and such that, at the level of the second semiconductor layer, a part of the trench extends under a part of the active region; deposition of one second dielectric layer in the trench; etching the second dielectric layer such that remaining portions of the second dielectric layer forms portions of dielectric material extending under a part of the active region; deposition of a third dielectric layer in the trench such that the trench is filled with the dielectric materials of the second and third dielectric layers and forms an isolation trench.

15 Claims, 10 Drawing Sheets

(56) References Cited

U.S. PATENT DOCUMENTS

| | | |
|---|---|---|
| 8,987,854 B2 | 3/2015 | Vinet et al. |
| 2003/0015764 A1 | 1/2003 | Raaijmakers et al. |
| 2004/0058549 A1 | 3/2004 | Ho et al. |
| 2005/0020027 A1 | 1/2005 | Lim et al. |
| 2009/0230508 A1 | 9/2009 | Dyer et al. |
| 2009/0278227 A1 | 11/2009 | Smith et al. |
| 2009/0289291 A1* | 11/2009 | Cheng ............... H01L 21/84 257/301 |
| 2010/0038745 A1 | 2/2010 | Wu et al. |
| 2010/0213522 A1 | 8/2010 | Cheng et al. |
| 2010/0252873 A1 | 10/2010 | Cheng |
| 2011/0068375 A1 | 3/2011 | Jakschik et al. |
| 2015/0044841 A1 | 2/2015 | Batude et al. |
| 2015/0056734 A1 | 2/2015 | Grenouillet et al. |

OTHER PUBLICATIONS

U.S. Appl. No. 14/575,329, filed Dec. 18, 2014, Maitrejea et al.
U.S. Appl. No. 14/425,977, filed Mar. 4, 2015, Vinet et al.
U.S. Appl. No. 14/425,891, Mar. 4, 2015, Grenouillet et al.

* cited by examiner

METHOD FOR FABRICATING MICROELECTRONIC DEVICES WITH ISOLATION TRENCHES PARTIALLY FORMED UNDER ACTIVE REGIONS

TECHNICAL FIELD

The invention relates to microelectronic devices fabricated with a semiconductor on insulator type substrate (SOI) and having active regions, or areas or zones, delimited by isolation trenches, for example of STI type ("Shallow Trench Isolation"). The invention is advantageously used for the production of FDSOI transistors (Fully-Depleted SOI) made with UTBB technology ("Ultra-Thin Body and Box"), especially for the fabrication of DRAM.

BACKGROUND OF THE INVENTION

The fabrication of microelectronic devices, such as transistors, in a SOI substrate comprises the realization of insulation trenches, for example of the STI type, that allow an electrical isolation of the active regions of the devices, made in the same SOI substrate, from each other.

The pattern of the isolation trenches made in the substrate is complementary to that of the active regions of the devices. An example of an isolation trench 8 of the STI type is shown in FIG. 1. This trench 8 is made in an SOI substrate 1 comprising a support layer 2, or thick layer, composed of semiconductor (typically of silicon) coated with a dielectric thin layer 4 called BOX (Burried OXide) and a thin layer 6, or surface layer, composed of semiconductor, here of silicon, and wherein the active regions of the devices are intended to be made. The isolation trench 8 bounds here two active regions 10a and 10b of two transistors made in the semiconductor thin layer 6. The isolation trench 8, composed of a dielectric material such as $SiO_2$, is made through the entire thicknesses of the semiconductor thin layer 6 and of the dielectric thin layer 4, and a part of the thickness of the support layer 2.

During the fabrication of the microelectronic devices in the substrate 1, after the making of the isolation trench 8, the substrate 1 usually undergoes several steps of cleaning and etching which can damage the insulation trench 8, such as cleaning steps performed with a hydrofluoric acid solution and after a gate etching or prior to silicidation or epitaxy steps. The semiconductor oxide of the isolation trench 8 is attacked by these steps and partially removed, both vertically and horizontally (see FIG. 2 onto which the dielectric material of the isolation trench 8 is partially withdrawn). Such degradations of the isolation trench 8 can lead to problems of electrical insulation between the support layer 2 and the thin layer 6, especially during the subsequent realization of electrical contacts in the vicinity of the isolation trench 8. In the example shown on FIG. 3, one of the electrical contacts 12 is intended to electrically contact a portion of the active region 10b near the isolation trench 8, this portion corresponding for example to a source or drain region of a transistor made in the active region 10b. However, in current technology nodes, given the short distance between two active regions (equal to about 50 nm in the 20 nm-node technology) which corresponds to the width of the isolation trench, a slight misalignment during the lithography made to form the electrical contact 12 can cause a shift of this electrical contact 12 on the isolation trench 8. Such a shift can also be intentional, some electrical contacts being made voluntarily overflowing on the isolation trench 8. However, given the partial withdrawal of $SiO_2$ of the isolation trench 8, this offset can lead to a short circuit between the active region 10b formed in the semiconductor thin layer 6 and the semiconductor of the support layer 2 (on the example of FIG. 3, a part of the electrical contact 12 is placed in a recess formed by the partial removal of the dielectric material of the isolation trench 8, thus short-circuiting the thin layer 6 with the support layer 2).

To solve this problem of degradation of the insulation trenches, a solution shown in FIG. 4 is, when performing an isolation trench 15, first to cover the walls (side walls and bottom wall) of the trench with a thin layer 14 (a liner) composed of a dielectric material more resistant than the semiconductor oxide used to make the isolation trench 8, for example silicon nitride. The remaining space of the trench is then filled with a semiconductor oxide 16, like $SiO_2$.

The parts of the SiN layer 14 forming the side walls of the isolation trench 15 strengthen the resistance of the isolation trench 15 vis-à-vis the steps of cleaning and etching.

However, although this solution partially avoids degrading the isolation trench during the steps of cleaning and etching, it does not completely eliminate the risk of short circuit described above. Indeed, during the etching of the electrical contacts, it is necessary to etch a thin nitride layer (called "contact etch stop layer"), which will result in the simultaneous etching of the nitride layer 14 and thus destroy the sealing made by the nitride layer 14. In addition, when the layer 14 is composed of a high permittivity dielectric, electrical performance degradations are observed as a result of an oxygen diffusion occurring through the liner.

BRIEF DESCRIPTION OF THE INVENTION

One aim of the present invention is to provide a method of producing a microelectronic device comprising at least one active region delimited by an isolation trench that is resistant vis-à-vis steps which can degrade the material(s) of the isolation trench, which avoids short circuits in the substrate even in case of partial withdrawal of the material (s) of the trench isolation, which enables to obtain a bottling process, that is a local enlargement of the dielectric of the isolation trench at the level of a second semiconductor layer, not limited by the dimensions and the shape of the isolation trench, and which enable to make an isolation trench without defects in the dielectric material(s) forming the isolation trench.

For this, the present invention proposes a method of producing a microelectronic device in a substrate comprising a first semiconductor layer disposed on a first dielectric layer, the first dielectric layer being disposed on a second semiconductor layer, comprising at least the following steps:
  etching of a trench through the first semiconductor layer, the first dielectric layer and a part of the thickness of the second semiconductor layer, defining, in the first semiconductor layer, at least one active region of the microelectronic device, and such that, in the second semiconductor layer, at least one part of the trench extends under a part of the active region,
  deposition of at least one second dielectric layer against walls of the trench,
  etching of a part of the second dielectric layer such that remaining portions of the second dielectric layer deposited in said part of the trench extending under a part of the active region form portions of dielectric material extending under a part of the active region,
  deposition of at least one third dielectric layer in the trench such that the trench is filled with at least the dielectric materials of the second dielectric layer and of the third dielectric layer and forms an isolation trench surrounding the active region.

Thus, the isolation trench comprises, at the level of the support layer of the substrate, that is the second semiconductor layer, one or more dielectric regions thicker than the rest of the isolation trench (thicker than parts of the isolation trench at the level of the first dielectric layer and of the first semiconductor layer) and which extend under the active region, for example where there is a risk of short circuit and/or where the thickness of the dielectric material of the isolation trench has no or a little impact on the electrical characteristics of the microelectronic device, for example under the regions of source and drain of a transistor which may correspond to the microelectronic device. In the event of partial withdrawal of a part of the dielectric material(s) of the isolation trench, the thicker dielectric regions thus ensure an electrical insulation of the second semiconductor layer vis-à-vis of one or more electrical contacts which may extend beyond over the isolation trench.

Such isolation trench therefore comprises one or more side walls which, at the level of the second semiconductor layer, are not vertically aligned with the active region bounded by the isolation trench at the level of the first semiconductor layer.

Moreover, in this method, cavities which extend under the active region, corresponding to said at least one part of the trench extends under a part of the active region, are filled with the dielectric material of the second dielectric layer, the rest of the isolation trench being then filled with one or more other dielectric layers (with at least the third dielectric layer) after the etching of a part of the second dielectric layer such that remaining portions of the second dielectric layer form portions of dielectric material extending under a part of the active region. Such filling of the isolation trench enables to avoid the formation of voids, or empty spaces, in the dielectric material filling the isolation trench.

Moreover, if a material like a resin is used for example as a mask before the complete filling of the isolation trench and thus deposited in the trench after the deposition and the etching of the second dielectric layer, the deposition of the second dielectric layer in the parts of the trench which extend under the active region enables to avoid a deposition of this material in these parts of the trench, and thus enables to remove easily the resin after its use as a mask.

The thickness of the second dielectric layer may be less than a half of a width of the isolation trench. The width of the isolation trench may correspond to the distance between two neighboring active regions isolated one to each other by the isolation trench.

The thickness of the second dielectric layer may be greater than or equal to a width of said part of the trench extending under a part of the active region. In this case, the deposition of the second dielectric layer enables to have a good filling of said part of the trench which extends under the active region.

A width of said part of the trench extending under a part of the active region may be less than or equal to a half of a width of the isolation trench, or a width of said part of the trench extending under a part of the active region may be greater than or equal to a half of a width of the isolation trench and less than or equal to a half of a height of said part of the thickness of the second semiconductor layer.

The etching step of a part of the second dielectric layer may be an anisotropic etching.

The method may further comprise, between the etching of the second dielectric layer and the deposition of the third dielectric layer, at least a deposition of a fourth dielectric layer against the remaining portions of the second dielectric layer, wherein the thickness of the fourth dielectric layer is less than or equal to a half of a width of the isolation trench, and wherein the third dielectric layer may be deposited over at least the fourth dielectric layer.

The dielectric materials of the second dielectric layer and of the third dielectric layer may comprise at least one semiconductor oxide.

The portions of the isolation trench which extend under the part of the active region may be in contact with parts of the first dielectric layer disposed under the active region.

The method may further comprise, between the etching of the trench and the deposition of the second dielectric layer, a step of producing at least one fifth dielectric layer forming side walls of the isolation trench against the first dielectric layer and the first semiconductor layer, the second dielectric layer being deposited against said fifth dielectric layer. The fifth dielectric layer may thus form a liner corresponding to the upper part of the side walls of the isolation trench.

In one embodiment, the active region may be substantially rectangular in shape and bounded by at least four side walls of the isolation trench extending through the first semiconductor layer, the first dielectric layer and said part of the thickness of the second semiconductor layer, and wherein, at the level of said part of the second semiconductor layer, two of the four side walls which are substantially parallel with respect to each other comprise the portions of dielectric material extending under a part of the active region and the two other side walls do not extend under the active region. Thus, the isolation trench comprises an asymmetrical profile such that at the level of the second semiconductor layer (that is the support layer of the substrate), the two side walls which extend under the active region avoid short circuits in the substrate even in the case of partial withdrawal of the materials of the isolation trench.

In this case, the method may further comprise, after the step of deposition of the third dielectric layer, a step of producing at least one transistor in the active region, the transistor comprising a gate made on a part of the active region and on a part of said two other side walls. The side walls which are oriented substantially perpendicular to the gate may correspond to those which do not extend under the active region (and in particular under the channel region of the transistor), and which are aligned vertically with the active region so as to not reduce the size of the ground plane of the transistor, and therefore does not shift the threshold voltage of the transistor from its nominal value. Moreover, this configuration also limits the degradation of short channel effects because the thickness of the dielectric which is buried under the channel is not changed.

The method may further comprise, after the deposition of the third dielectric layer, a step of producing at least one transistor in the active region, the transistor comprising a gate made on a part of the active region and on a part of said two other side walls.

According to another embodiment, the active region may be substantially rectangular in shape and bounded by side walls of the isolation trench extending through the first semiconductor layer, the first dielectric layer and said part of the thickness of the second semiconductor layer, and wherein, at the level of said part of the second semiconductor layer, the side walls extend under a part of the active region. In this variant, at the level of the second layer of semiconductor, all side walls of the isolation trench may extend beyond under the active region, and be in contact with a portion of the first dielectric layer which is disposed under the active region. Thus, according to this embodiment, at the level of the second semiconductor layer, none of the side walls of the isolation trench at the level of the second semiconductor layer is vertically aligned with the bounds of active region delimited by the part of the isolation trench at the level of the first semiconductor layer.

The method may further comprise, after the deposition of the third dielectric layer, a step of producing at least one transistor in the active region, the transistor comprising a gate made on a part of the active region.

BRIEF DESCRIPTION OF THE DRAWINGS

The present invention will be better understood upon reading the description of embodiments given purely indicative and in no way limiting with reference to the accompanying drawings, in which.

Identical, similar or equivalent parts of the different figures described hereinafter bear the same numerical references so as to facilitate the transition from one figure to another.

The different parts illustrated in the figures are not necessarily shown using a uniform scale, to make the figures more legible.

The different possibilities (alternatives and embodiments) must be understood as not being mutually exclusive and may be combined with one another.

DETAILED DESCRIPTION OF SPECIFIC EMBODIMENTS

Figure 1:
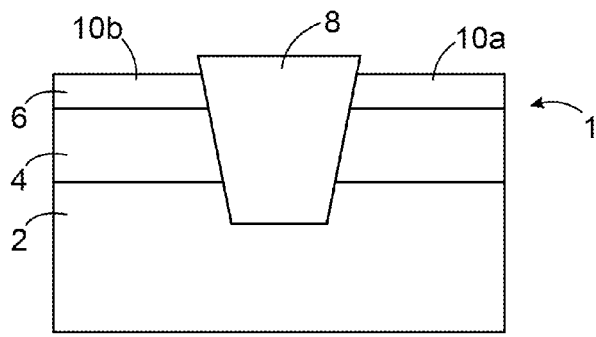
FIGS. 1 to 4 show isolation trenches according to prior art.
Figure 2:
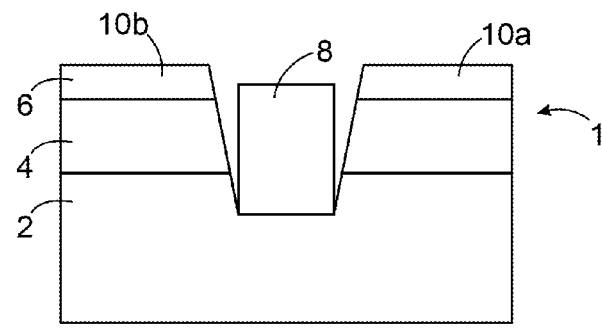
Figure 3:
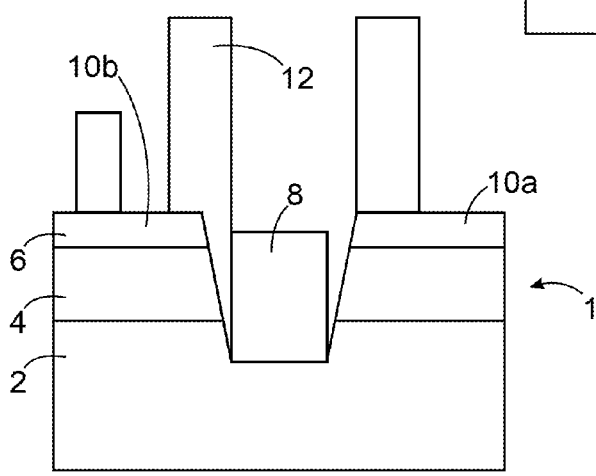
Figure 4:
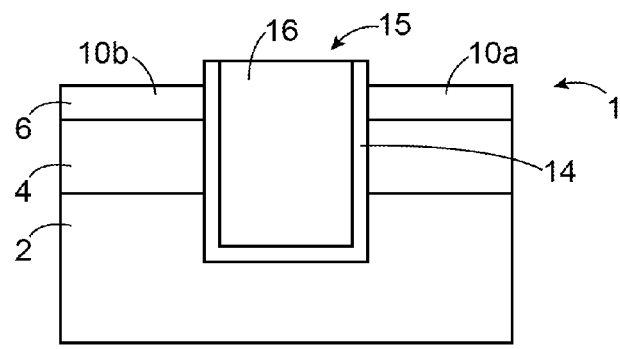
Figure 5:
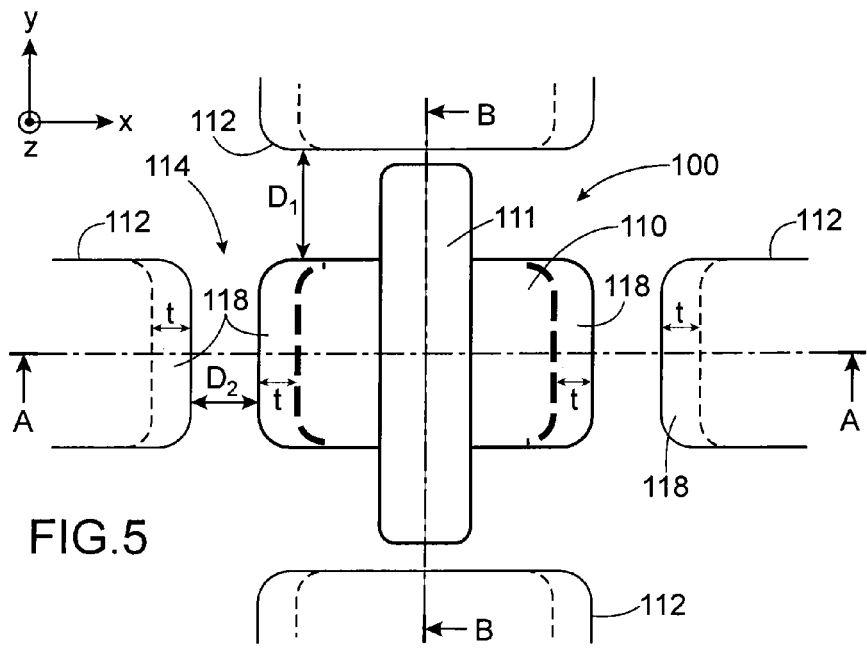
FIGS. 5 to 7 show a microelectronic device produced with a method according to a first embodiment of the invention.
Figure 6:
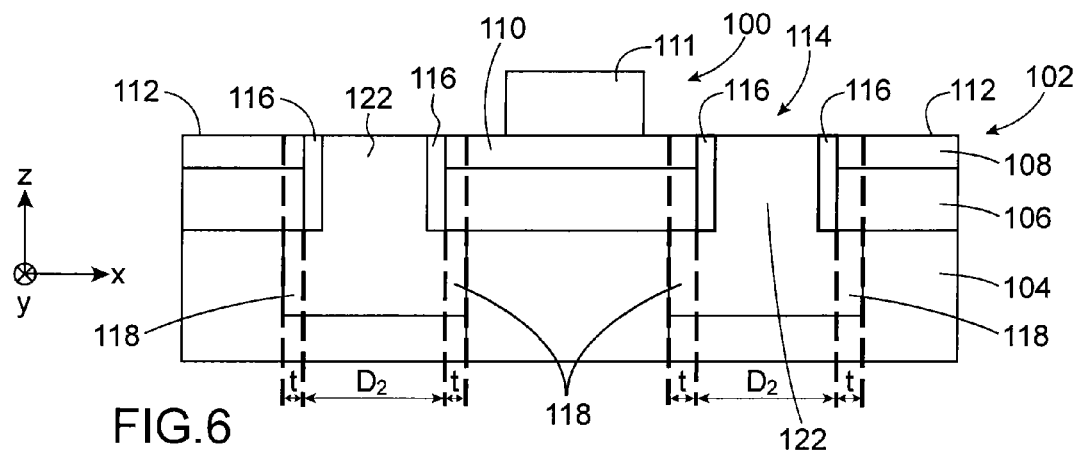
Figure 7:
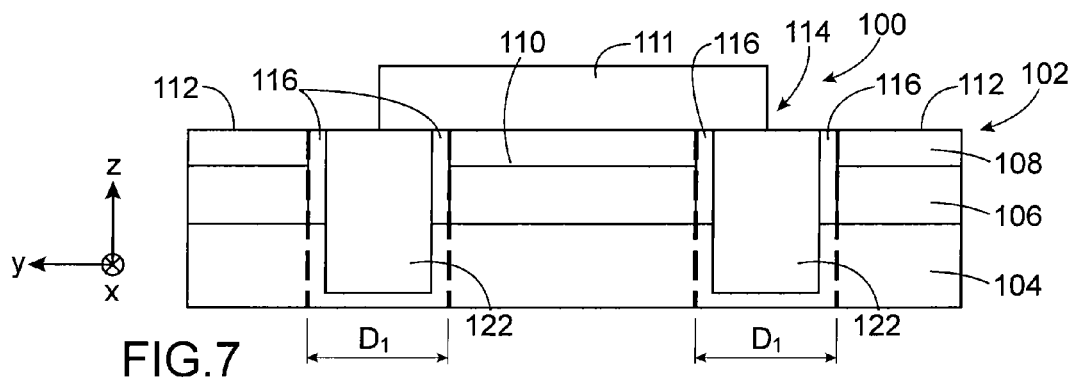
Figure 8:
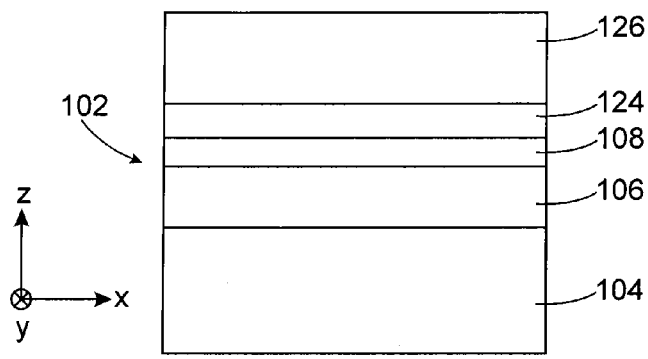
FIGS. 8 to 20B show steps of a method of producing a microelectronic device according to the first embodiment of the invention.

Referring first to FIGS. 5-7 which show schematically a microelectronic device 100, here a FDSOI transistor of the UTBB type, produced with a method according to a first embodiment which will be further described. FIG. 5 is a top view of the transistor 100, and FIGS. 6 and 7 are cross-sectional views respectively along lines AA and BB shown in FIG. 5.

The transistor 100 is produced in a substrate 102 of SOI type comprising a support layer 104, or thick layer, composed of semiconductor, for example silicon-based, a dielectric thin layer 106 (BOX), for example composed of $SiO_2$, and a thin layer 108, or surface layer, composed of semiconductor, here silicon. A part of the semiconductor thin layer 108 corresponds to an active region 110 of the transistor 100 comprising a channel, a source region and a drain region of the transistor 100. A gate 111 of the transistor 100 is formed on the active region 110.

Other active regions 112 of other microelectronic devices are also made in the substrate 102 and shown in FIGS. 5-7. The active region 110 is isolated from the other active regions 112 by an isolation trench 114 the design of which being complementary to that of all the active regions made in the substrate 102. The distance between two active regions (corresponding to the distances $D_1$ and $D_2$ shown in FIG. 5) corresponds to the width of the isolation trench 114, and is for example between about 40 nm and 1 µm. For microelectronic devices made with 20 nm-node technology, the width of the isolation trench 114 is for example between about 40 nm and 200 nm. The isolation trench 114 bounds the active region 110. $D_1$ may be equal or not to $D_2$.

The isolation trench 114 is made through the entire thicknesses of the semiconductor thin layer 108 and of the dielectric thin layer 106, and through a part of the thickness of the semiconductor support layer 104. At the level of the semiconductor thin layer 108 and of the dielectric thin layer 106, the side walls of the isolation trench 114 are formed by a dielectric layer 116 composed of nitride semiconductor, here SiN, or a bilayer of SiN/SiO2, or a high-k dielectric (with a permittivity greater than about 3.9) such as $HfO_2$ or HfSiON. This dielectric layer 116, whose thickness is for example between about 5 nm and 15 nm, in particular allows to prevent, during the realization of the isolation trench 114 which will be described below, a damage of the semiconductor of the thin layer 108 and of the dielectric material of the dielectric thin layer 106 during the making of the isolation trench 114 (for example preventing an ionic implantation in the semiconductor of the thin layer 108 or a HCl etching of the layer 108). For reasons of clarity of the drawings, the layer 116 is not visible in FIG. 5.

At the level of the support layer 104, the side walls of the isolation trench 114 are formed by portions of dielectric material, here $SiO_2$, whose thickness varies depending on the orientation of these walls vis-à-vis the gate 111 of the transistor 100. Indeed, around the active region 110 which is rectangular in shape, the isolation trench 114 has four side walls which are parallel in pairs. At the level of the side walls of the isolation trench 114 which are not covered by the gate 111, that is to say that do not cross the gate 111 (these side walls being oriented parallel to the grid 111 which spreads along a direction corresponding to the Y axis in FIGS. 5 to 7, that is the grid has main sides parallel to this direction which corresponds to the Y axis), dielectric portions 118 which have a thickness t (dimension along the X axis) between about 5 nm and 10 nm form the side walls of the isolation trench 114 in the semiconductor support layer 104 under active regions 110, 112. According to other variants, the thickness t of the dielectric portions 118 may be between about 5 nm and 50 nm. These portions 118 are arranged under the active region 110 (see FIG. 6). The portions 118 are in contact with a part of the dielectric layer 106 located under the active region 110. The portions of dielectric material 118 forming two side walls of the isolation trench 114 are delimited symbolically by broken lines in FIG. 5.

The remainder of the isolation trench 114 is filled with one or several dielectric materials 122, here $SiO_2$. Thus, at the level of the side walls of the trench which are oriented perpendicularly to the gate 111, the dielectric material 122 form the side walls of the isolation trench 114 at the level of the support layer 104 and is not arranged under the active region 110.

The dielectric material forming the isolation trench 114 is obtained with depositions of several dielectric layers, as explained below.

A method for producing the microelectronic device 100 according to the first embodiment is described in relation with FIGS. 8-20B.

The transistor 100 is made from a standard pre-STI stack comprising the SOI substrate 102 onto which are stacked an oxide layer (e.g. $SiO_2$-based) 124 and a nitride layer (here SiN-based) 126. The layers of this stack shown in FIG. 8 have here the following thicknesses:

nitride layer 126: 80 nm, or between about 50 nm and 100 nm,
oxide layer 124: 10 nm, or between about 3 nm and 10 nm,
thin layer of silicon 108: 7 nm,
thin dielectric layer 106: 25 nm,
thick silicon layer 104: 700 µm.

These thicknesses are given as an indication for a transistor 100 manufactured using the 20 nm-node UTBB technology. However, these thicknesses may vary, according to the implementation options considered and also the technology node with which the device 100 is made.

Figure 9A:
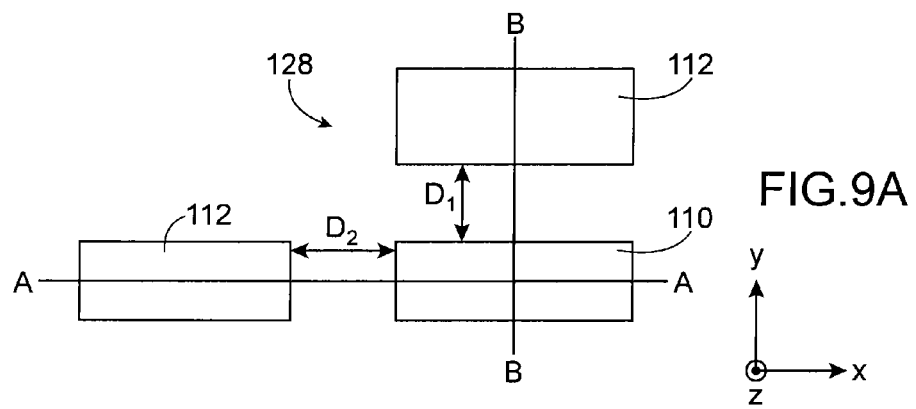
Figure 9B:
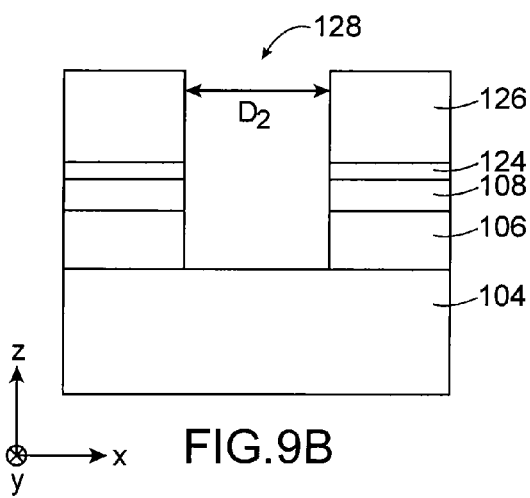
Figure 9C:
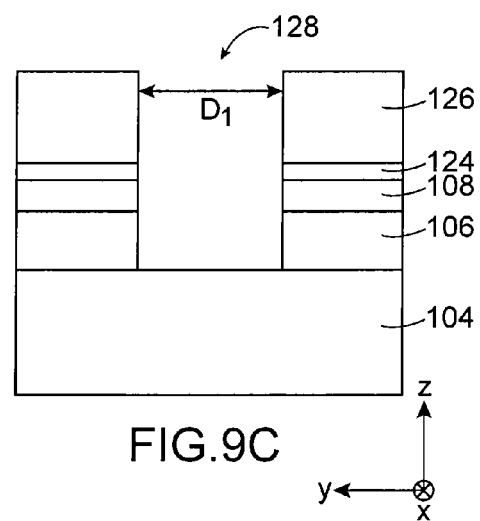

A trench 128, whose design is complementary to that of the active regions to achieve in the substrate, is etched through the nitride layer 126, the oxide layer 124, the thin layer of semiconductor 108 and the thin dielectric layer 106 (but not through the thick layer 104). In the example of FIGS. 9A to 9C (FIGS. 9B and 9C are cross-sectional views respectively along the lines AA and BB shown in FIG. 9A), the active region 110 of the transistor 100 intended to form a channel, a source region and a drain region of the device 100 in the semiconductor layer 108, is spaced from the other active regions 112 of a distance $D_1$ or $D_2$ between about 40 nm and 50 nm, corresponding to the width of the trench 128. This etching may correspond to an anisotropic etch with a stop at the level of the interface between the support layer 104 and the thin dielectric layer 106.

Figure 10A:
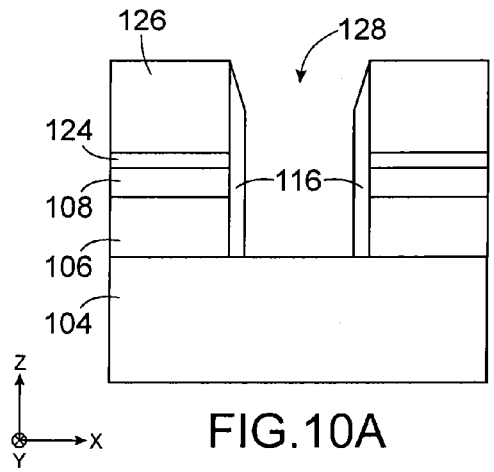
Figure 10B:
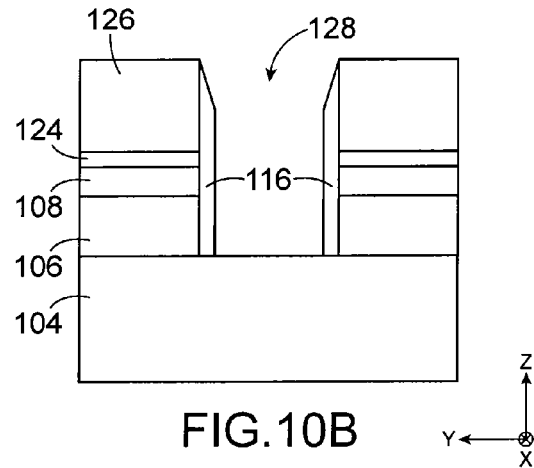

The side walls of the trench 128 are then protected with the dielectric layer 116 composed for example of nitride semiconductor, here SiN, and produced against the side walls of the trench 128 (see FIGS. 10A and 10B). The dielectric layer 116 is formed as a spacer around the remaining portions of the layers 126, 124, 108 and 106, that is against the side walls of the layers 126, 124, 108 and 106 located inside the trench 128. The thickness of the dielectric layer 116 may be between about 3 nm and 15 nm for microelectronic devices made with 22 nm-node technology. The maximum thickness of the dielectric layer 116 depends on distance $D_1$ or $D_2$ which has to be respected according to the technology node with which the device is made. The dielectric layer 116 is produced with a conformal deposition of the dielectric material (that is a deposition with a regular thickness against the sidewalls of the trench 128 and also against the bottom walls of the trench 128 and on the nitride layer 126). An anisotropic etching, e.g. a RIE (Reactive Ion Etching), is then carried out in order to etch the portions of the dielectric material previously formed against the bottom wall of the trench 128 and on the nitride layer 126, thus forming the dielectric layer 116 as a spacer around the portions of layers 126, 124, 108 and 106.

According to another embodiment, the dielectric layer 116 may comprise a bilayer of $SiN/SiO_2$, or a high-k dielectric (with a permittivity greater than about 3.9) such as $HfO_2$ or HfSiON.

Figure 11A:
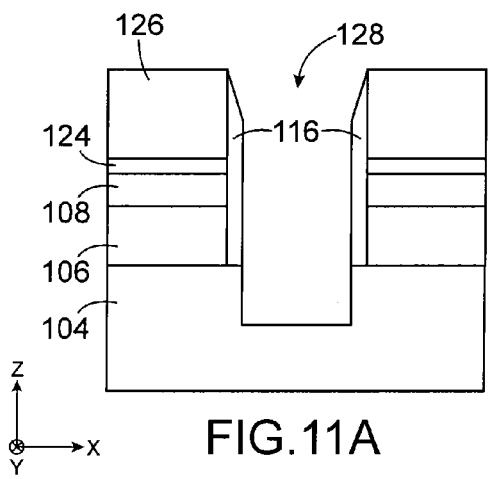
Figure 11B:
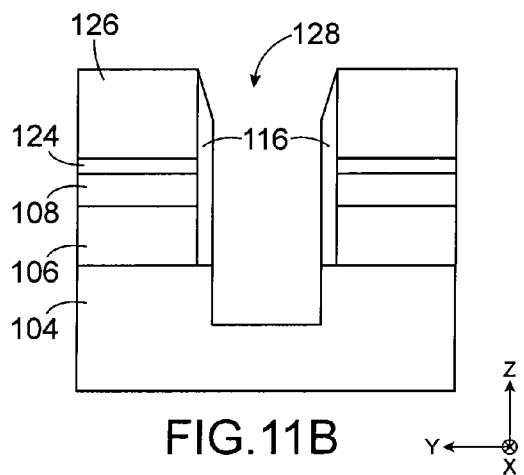

As shown in FIGS. 11A and 11B, the trench 128 is then extended through a part of the thickness of the semiconductor support layer 104. In the example described here, the total depth of the trench 128 (through the layers 126, 124, 108, 106 and 104) is for example equal to about 200 nm, and may be between 100 nm and 300 nm.

Figure 12A:
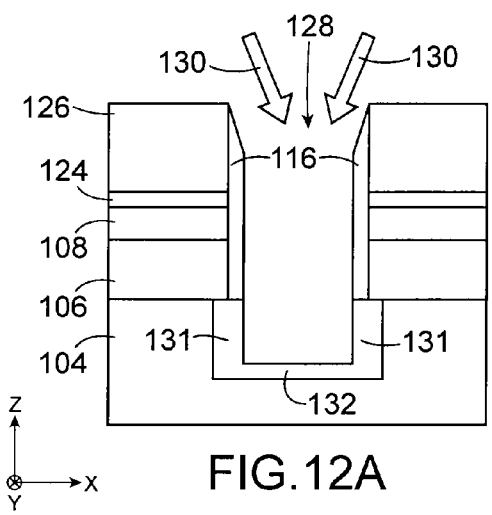
Figure 12B:
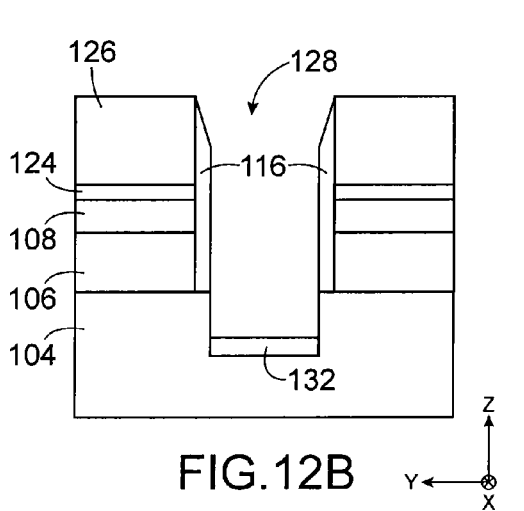

As shown in FIGS. 12A and 12B, an ionic implantation is then carried out in the semiconductor of the layer 104 exposed in the trench 128, that is in the walls of the layer 104 at the level of the trench 128. This ionic implantation is carried out in order to locally modify the crystallographic properties and/or the chemical properties of the semiconductor of the layer 104 exposed in the trench 128. This ionic implantation is implemented such that the crystallographic properties and/or the chemical properties of the semiconductor of the parts of the side walls of the trench 128 at the level of the thick layer 104 are transformed through a thickness which depends on the parameters of the ionic implantation.

In the first embodiment described here, this implantation is performed only in the side walls which are parallel to the main dimension of the gate of the transistor 100, that is to say, extending parallel to the Y axis. Thus, as represented in FIG. 12A, portions 131 composed of semiconductor with modified crystallographic properties and/or chemical properties form these side walls. Such implantation is performed using ion beams 130 forming a zero angle with the plane (X,Z). Thus, the ion beams 130 do not perform a modification of the crystallographic properties and/or the chemical properties of the semiconductor at the level of the side walls of the trench 128 extending parallel to the axis X. The beams 130 form for example an angle equal to about 15° with the normal to the substrate 102 (that is to say an angle of about 15° with respect to the Z axis). The angle of beams 130 is adapted according to the depth of the trench 128 (e.g. 200 nm) and its lateral dimensions (width, e.g. 50 nm), and may be between about 5° and 30°.

Figure 13A:
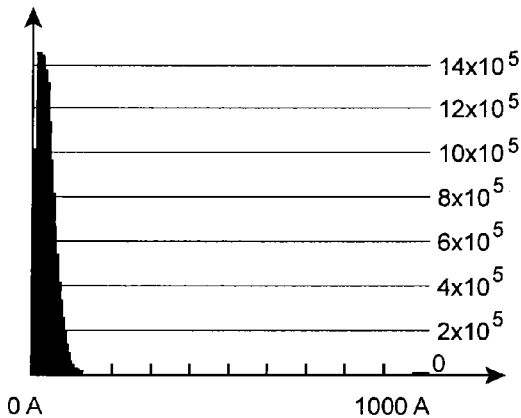
Figure 13B:
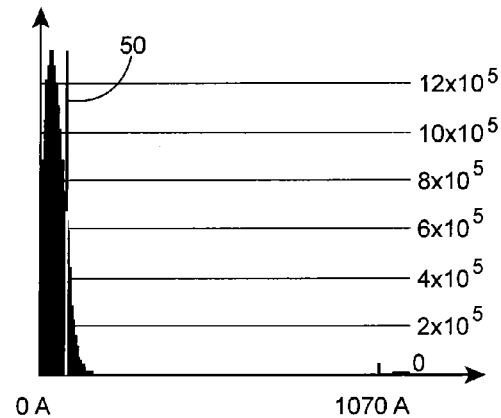

The dielectric layer 116 formed along the side walls of the trench 128, at the level of the layers 106, 108, 124 and 126 of the stack, protects these layers, and especially the thin silicon layer 108, against the beams 130, thereby preventing an ionic implantation in the silicon thin film 108. By way of illustration, FIGS. 13A and 13B show the concentration ratios $at \cdot cm^{-3}/at \cdot cm^{-2}$ obtained respectively in silicon (see FIG. 13A) and in silicon covered with a layer of SiN with a thickness equal to about 6 nm (see FIG. 13B), depending on the depth in the implanted materials. In FIG. 13B, the silicon (the reference 50 corresponds to the limit SiN/Si) does not undergo almost the implantation performed.

All the bottom wall of the trench 128, that is also the bottom wall of the parts of the trench 128 extending parallel to the axis X, undergoes the ionic implantation in a similar manner to the side walls which extend parallel to the Y axis, at the level of the support layer of semiconductor 104. Thus portions 132 composed of semiconductor with modified crystallographic properties and/or modified chemical properties correspond to the bottom wall of the trench 128.

According to the nature of the ionic species which are implanted in the semiconductor, the crystallographic properties and/or the chemical properties of the semiconductor are modified. According to a first variant, it is possible to implant ionic species such that the implanted semiconductor becomes amorphous. In this case, ionic species, such as for example argon and/or nitrogen (or eventually ionic species like arsenic and/or phosphorus if a n-type ground plane is desired), are implanted in the semiconductor (in this case, the substrate 102 comprises initially a thick layer 104 composed of crystalline semiconductor, and especially monocrystalline semiconductor in case of CMOS transistor). After the implantation, these species don't change the doping of the semiconductor and don't form an alloy based on the implanted semiconductor. The dose of implanted ionic species is chosen such that the implanted semiconductor becomes amorphous semiconductor, e.g. chosen greater than $5.10^{14}\ cm^{-2}$. The table bellow gives the thickness (in nm) of the implanted semiconductor with beams of argon, with a tilt angle of 20°, for different values of the dose and of the energy of the beams, in silicon:

|  | Energy (keV) | | | | | |
|---|---|---|---|---|---|---|
|  | 2 | | 4 | | 8 | |
| Dose (cm$^{-2}$) | a/c | Rp | a/c | Rp | a/c | Rp |
| 5E+14 | 4.8 | 5.7 | 8.2 | 10.6 | 14.7 | 18.2 |
| 1E+15 | 5.7 | 5.3 | 10.1 | 9 | 18.1 | 15.3 |

The parameter "a/c" corresponds to the limit amorphous/crystalline in the implanted semiconductor, that is corresponds to the lateral amorphization depth. The parameter "Rp" corresponds to the desired depth implantation.

Thus it is possible to choose the thickness of the implanted semiconductor (in FIG. 12A, this thickness corresponds to the dimension along the X axis for the lateral portions 131, and the dimension along the Z axis for the bottom portion 132) by modifying one or several of the following parameters: dose, energy, nature of the implanted ionic species, angle of the ionic beams.

According to a second variant, it is possible to implant ionic species in the semiconductor such that this implantation creates a new compound of the semiconductor and of the implanted species. For example, it is possible to implant germanium and/or carbon in the semiconductor such that the portions 131 and 132 are composed of a compound of this semiconductor and of the implanted species (e.g. composed of SiGe and/or SiC if the layer 104 is composed of silicon). Moreover, in this second variant, according to the implantation dose, it is possible that this implantation also modify the crystallographic properties of the implanted material, which may be amorphous if the semiconductor is initially crystalline. For example, an implantation of germanium in crystalline silicon, with an energy of between 4 keV and 10 keV, and a dose equal to about 1E+16 cm$^{-2}$ leads to an portion of amorphous SiGe with a thickness equal to about 10 nm.

During the ionic implantation, a small part of the semiconductor of the thin layer 108, at the level of the side walls of the trench 128 may become amorphous. However, this part of amorphous semiconductor will become again crystalline during a further annealing made during the process, as described further.

Figure 14A:
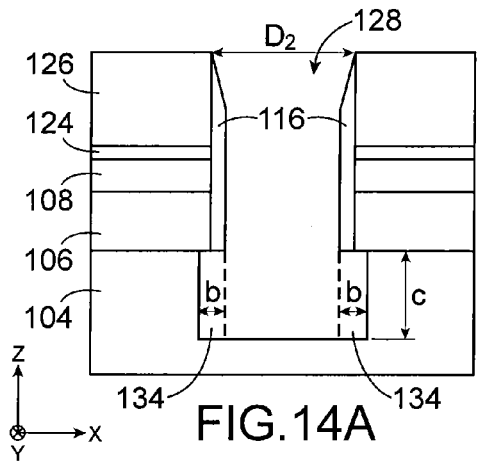
Figure 14B:
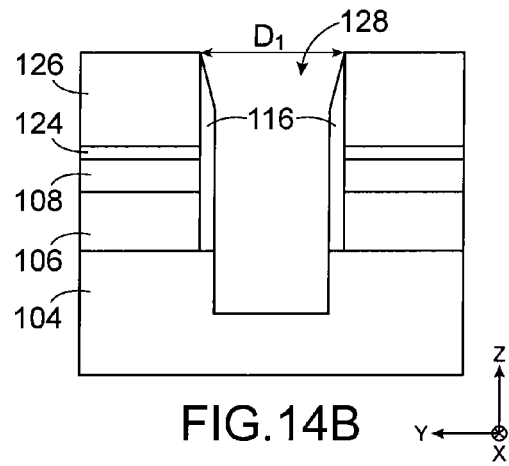

The portions 131 and 132 of semiconductor with modified crystallographic properties and/or modified chemical properties are then removed as shown in FIGS. 14A and 14B. This step may correspond to a vapor phase etching, or gaseous phase etching, using HCl as etching agent. When the ionic implantation corresponds to an implantation of neutral species like nitrogen, argon or arsenic, this etching is implemented for example at a temperature which is less than about 600° C., e.g. equal to about 550° C., and with a partial pressure of 30000 Pa (or which may be between about 100 Pa and 10$^5$ Pa) in order to have a re-crystallization speed which is lower than the etching speed (this re-crystallization corresponds to the amorphous semiconductor 131, 132 which becomes again crystalline). When the implantation creates an alloy composed of the semiconductor and of the implanted species (for example germanium or carbon), the temperature of the etching step may be greater than 600° C. because the re-crystallization of portions 131, 132 has no impact on the etching (even if the portions 131, 132 become again crystalline, the chemical composition of the portions 131, 132 remains different than that of the layer 102). It is possible to etch selectively the portions 131 and 132 because the crystallographic and/or chemical properties of the portions 131 and 132 are different than the crystallographic and/or chemical properties of the non-implanted semiconductor of the layer 104. The previous step of implantation enables to obtain an etching selectivity between the implanted portions 131, 132 and the non-implanted semiconductor of the layer 104. For example, the etching speed of amorphous silicon is about 100 times larger than the etching speed of monocrystalline silicon when HCl is used as etching agent.

For example, it is possible to implant argon in monocrystalline silicon with energy equal to about 8 keV, a dose equal to about $5.10^{15}$ cm$^{-2}$, and a tilt angle equal to about 15°. An etching with HCl at a temperature equal to about 590° C. enables to remove between about 5 nm and 10 nm of silicon under the future active region of the device.

The part of the trench 128 corresponding to the volume previously occupied by the portions 131 correspond to parts 134 of the trench 128. In the example described here, a width b of the parts 134 of the trench 128 intended to be extended under a part of the active region, which corresponds to the width of the previous portions 131 (between about 5 nm and 10 nm in the example described here), is less than a half of the width $D_2$, whatever the value of a height c of the etched material in the layer 104.

According to another variant, the trench 128 obtained may be such that the width b of said parts 134 of the trench 128 intended to be extended under a part of the active region is greater than or equal to a half of the width $D_2$ of the isolation trench 128 and less than or equal to a half of the height c.

The making of the isolation trench is then achieved with the filling of the trench 128 via the deposition of several dielectric layers.

Figure 15A:
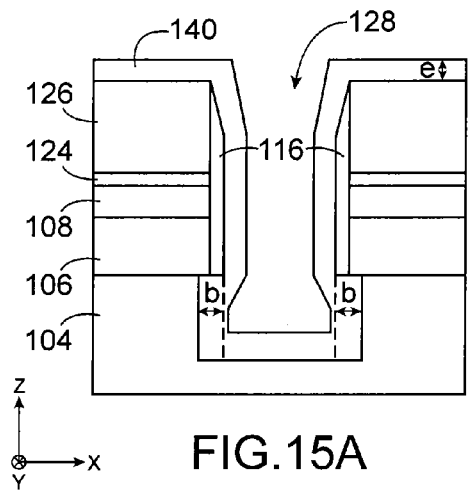
Figure 15B:
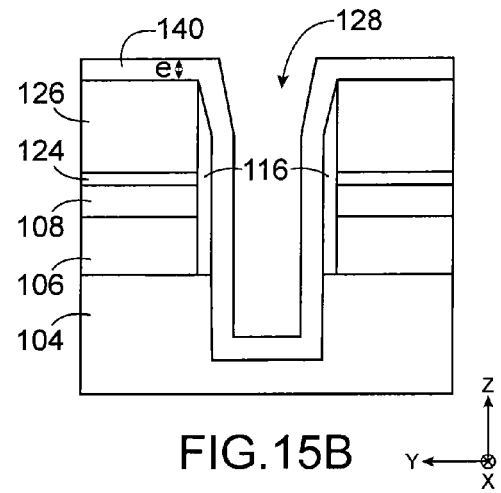

As shown in FIGS. 15A and 15B, a dielectric layer 140, for example composed of SiO$_2$, is deposited against walls of the trench 128 (side walls and bottom walls) but also on the nitride layer 126. This dielectric layer 140 is produced with a conformal deposition of the dielectric material (that is a deposition with a regular thickness against the sidewalls of the trench 128 and also against the bottom walls of the trench 128 and on the nitride layer 126).

The thickness e of the dielectric layer 140 is chosen such that spaces 134 of the trench 128 extending under a part of the active region are completely filled with the dielectric material of the dielectric layer 140. Thus, the thickness e of the dielectric layer 140 is here greater than or equal to a width b of the parts 134 of the trench 128 intended to be extended under a part of the future active region (as shown in FIG. 15A). The width b of the parts 134 is equal to the thickness t of portions 118 previously described. However, the thickness e of the dielectric layer 140 is less than a half of a width of the trench 128, that is less than $D_1/2$ and $D_2/2$ in order to avoid the formation of voids, or empty spaces, in the dielectric material intended to fill the trench 128. For a trench 128 comprising a width equal to about 40 nm, the thickness e of the dielectric layer 140 may be between about 15 nm and 20 nm.

An anisotropic etching, e.g. a RIE (Reactive Ion Etching), is then carried out in order to etch the portions of the dielectric layer 140 previously formed against the bottom walls of the trench 128 and on the nitride layer 126, thus forming a spacer over the layer 116 and in the etched part of the semiconductor layer 104. In the etched part of the semiconductor layer 104, the layer 140 thus forms the portions 118 intended to be placed under the future active regions of devices which will be made.

Figure 16A:
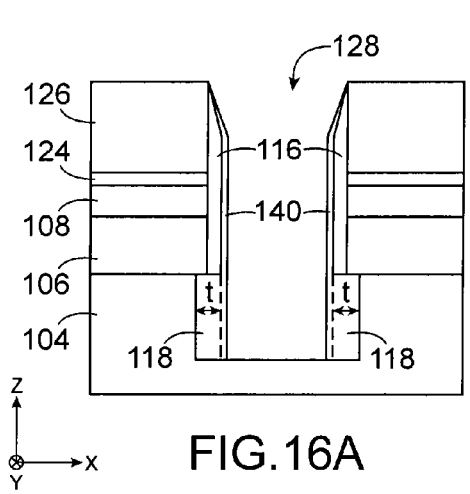
Figure 16B:
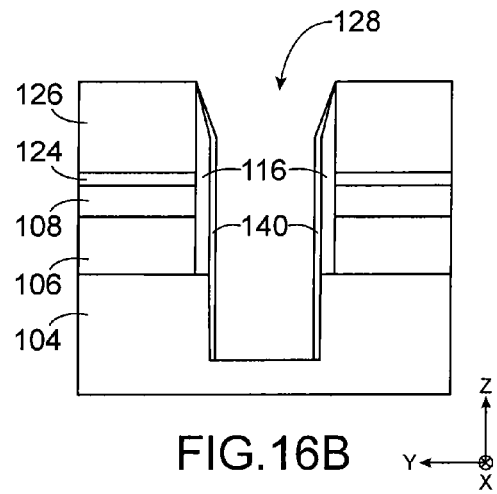

In the embodiment described here, an over-etch step is carried out in order to reduce the thickness of the spacer formed by the layer 140 along the sidewalls of the trench 128 (as shown in FIGS. 16A and 16B). This over-etching step enables to make easier following filling of dielectric layers in the trench. This over-etching step is limited in order to reduce the consumption of the nitride layer 126. In order to reduce the thickness of the remaining portions of the layer 140 against the spacer formed by the dielectric layer 116, the initial thickness e of the dielectric layer 140 may be chosen as close as possible to the width b.

Figure 17A:
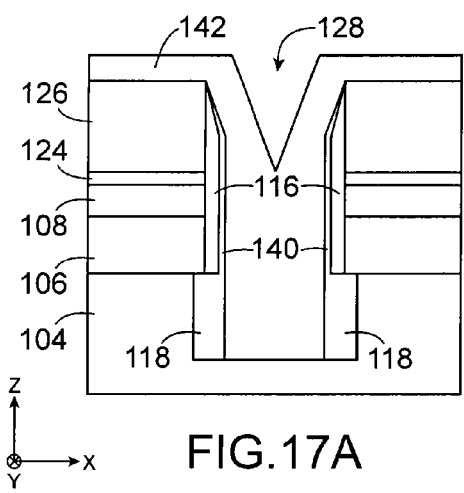
Figure 17B:
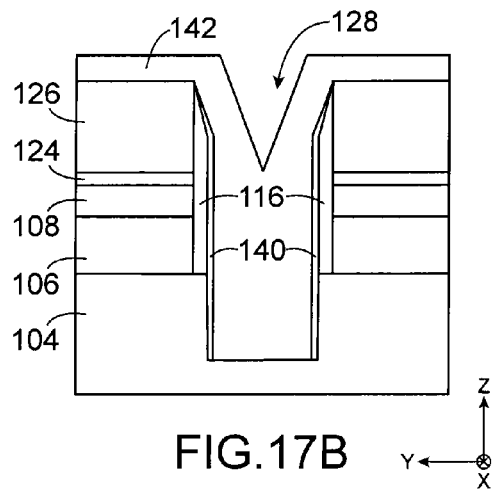
Figure 18A:
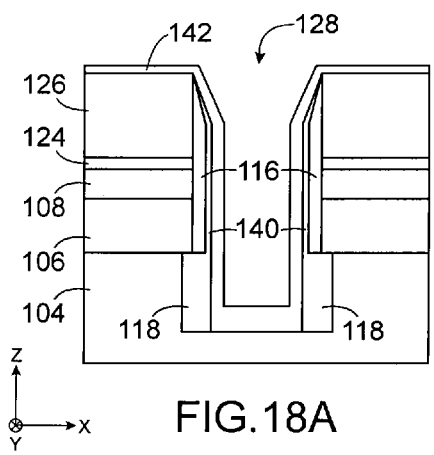
Figure 18B:
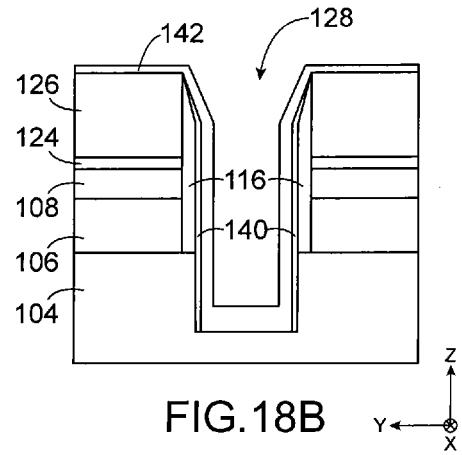

As shown in FIGS. 17A and 17B, another dielectric layer 142, for example composed of $SiO_2$ and with a thickness between about 15 nm and 20 nm, is deposited in the trench 128, thus covering the layer 140. The dielectric layer 142 is then etched (e.g. with an isotropic etching), at the level of the top of the trench 128, in order to enlarge the trench 128 (see FIGS. 18A and 18B).

Figure 19A:
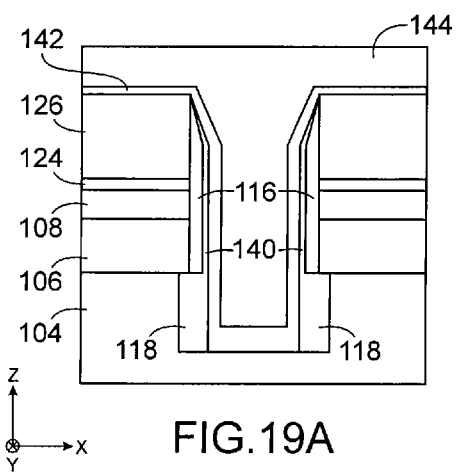
Figure 19B:
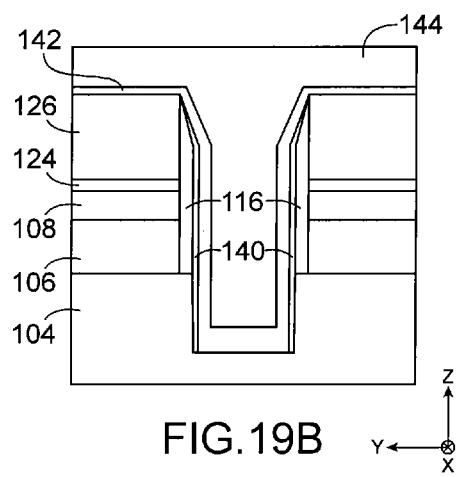
Figure 20A:
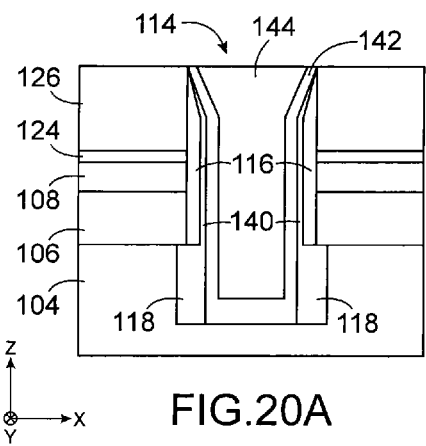
Figure 20B:
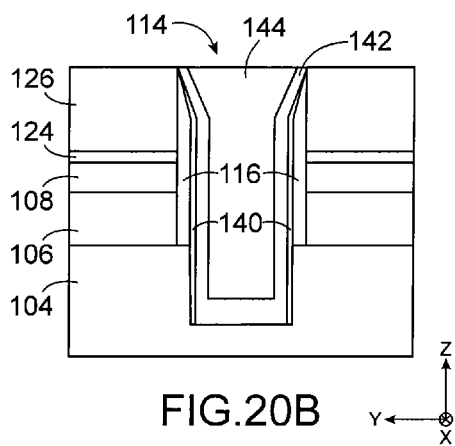

As shown in FIGS. 19A and 19B, a thick dielectric layer 144 (for example with a thickness equal to about 500 nm) is deposited in order to completely fill the trench 128. The isolation trench 114 is then achieved with the etching of the portions of dielectric material which are found deposited outside of the trench 128 (here corresponding to parts of the layers 142 and 144), e.g. by performing a CMP, the dielectric layer 126 serving as a stop layer during this planarization.

An annealing of the obtained isolation trench 114 is then carried out, for example at a temperature equal to about 1050° C. and during about 30 minutes.

The layers 124 and 126 are then removed in order to reveal the thin layer of semiconductor 108. The various components of the transistor 100 are then made from the thin layer of semiconductor 108 (gate dielectric, gate, creation of source and drain regions, etc.).

The above described method for making the isolation trenches is applied especially when the ratio c/b is greater than or equal to 2.

Figure 21:
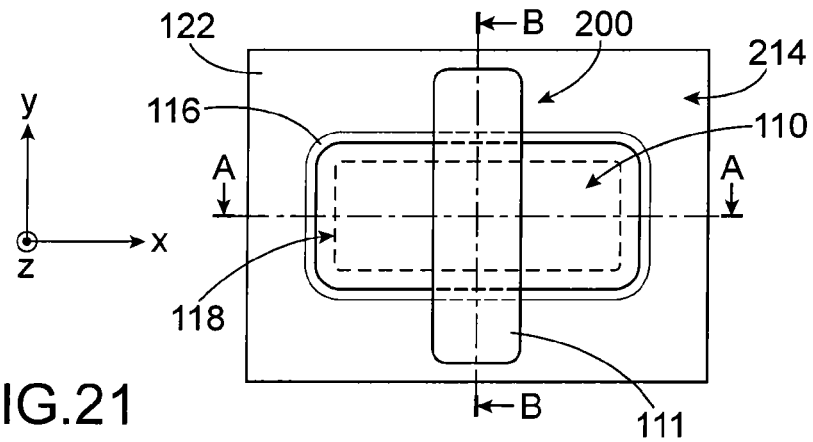
FIGS. 21 to 23 show a microelectronic device produced with a method according to a second embodiment of the invention.
Figure 22:
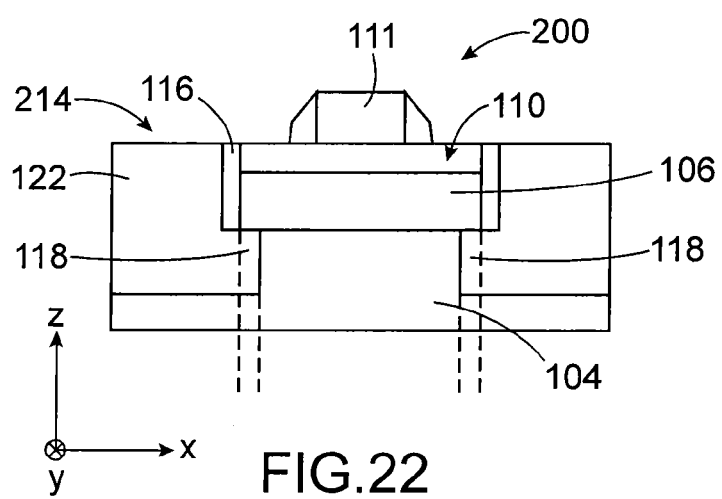
Figure 23:
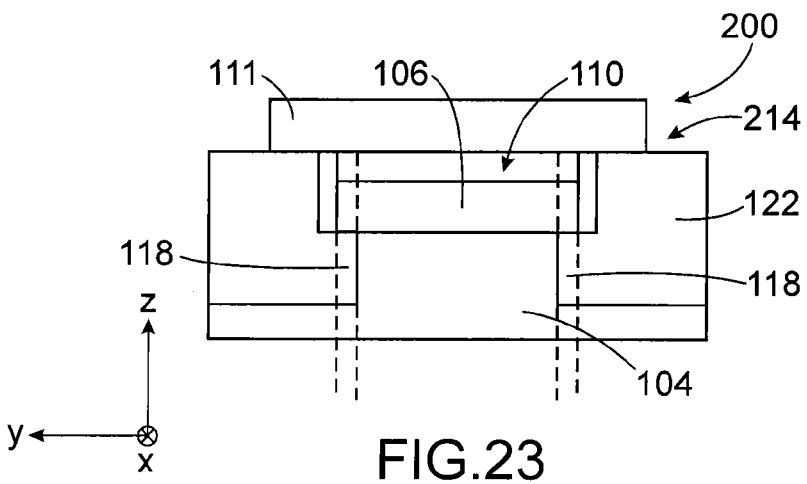

FIGS. 21 to 23 show schematically a microelectronic device 200, here a FDSOI transistor of the UTBB type, according to a second embodiment.

FIG. 21 is a top view of the transistor 200, FIGS. 22 and 23 are cross-sectional views respectively along lines AA and BB shown in FIG. 21.

Compared to the previously described device 100 in which only two of the four side walls of the isolation trench 114 extend under the active region 110, the four side walls of the isolation trench 214 of the device 200 all extend under the active region 110. The dielectric portions 118 are therefore present in the entire periphery of the active region 110.

Such isolation trench 214 is achieved via a ionic implantation (according to the first or the second variant as disclosed previously) of all side walls of the trench at the level of the thick semiconductor layer 104, for example analogously to the achievement of the portions 118 of transistor 100 described above. The dielectric portions 118 are in contact with the part of the dielectric layer 106 located under the active regions 110.

However, the extension of the trench 128 through a part of the thickness of the semiconductor support layer 104 may be obtained with a technique which is different than the ionic implantation previously described.

A second embodiment of the method for producing the microelectronic device 200 is now disclosed in FIGS. 24A-28B.

The device 200 is made from a standard pre-STI stack comprising a monocrystalline SOI substrate 102. In this second embodiment, the support layer 104 is composed of monocrystalline semiconductor, for example monocrystalline silicon. The thin layer 108, or surface layer, may also be composed of semiconductor, here monocrystalline silicon.

Figure 24A:
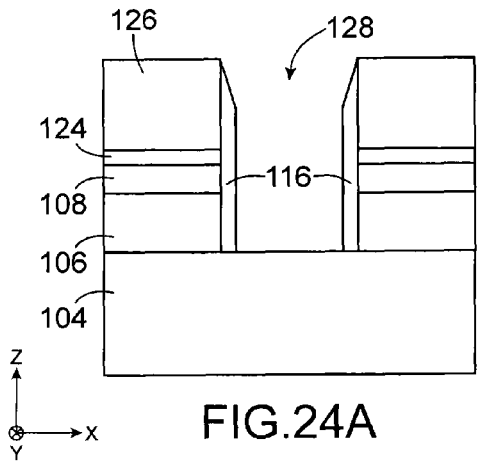
FIGS. 24A to 28B show steps of a method of producing a microelectronic device according to the second embodiment of the invention.
Figure 24B:
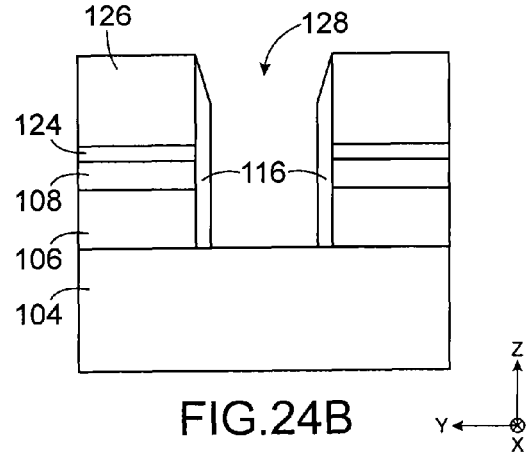

Also, as in the first embodiment, the trench 128 is etched through the nitride layer 126, the oxide layer 124, the thin layer of semiconductor 108 and the thin dielectric layer 106 (but not through the thick layer 104), as shown in FIGS. 24A-24B. The side walls of the trench 128 are then protected with the dielectric layer 116.

Figure 25A:
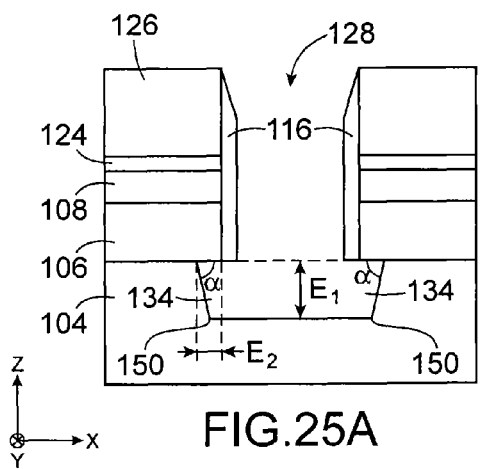
Figure 25B:
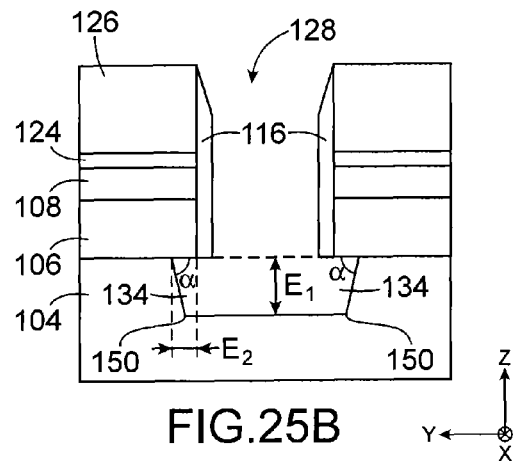

As shown in FIGS. 25A and 25B, a chemical vapor etching (CVE) is then carried out at the level of the bottom of the trench 128, through a part of the thickness of the monocrystalline semiconductor-based support layer 104, thus forming parts 134 extending under the active regions. This etching is done using HCl as etching agent, at a temperature between about 600° C. and 950° C., and at high pressure, that is between about 10 and $10^5$ Pa. As the crystalline orientation of the monocrystalline semiconductor of the support layer 104 is {100}, such etching enables to etch both crystalline planes {100} and {111} of the support layer 104. The etching of the crystalline plane {100} corresponds to an etching of the semiconductor perpendicularly to the main plane of the support layer 104, that is parallel to the axis Z shown in FIGS. 25A and 25B.

The etching according to the crystalline plane {100} correspond to an etching of a portion of the monocrystalline semiconductor of the support layer 104 with a thickness corresponding to the dimension $E_1$ shown in FIGS. 25A and 25B. In order to have an isolation trench deep enough to ensure a good electrical insulation in view of a possible shift of an electrical contact on the isolation trench, but also to have an isolation trench not too deep in order to have an electrical continuity between ground planes of two active zones one placed next to the other, the dimension $E_1$ may be less than or equal to about 40 nm. The etching according to the crystalline plane {111}, which forms with the crystalline plane {100} an angle α equal to about 54.7°, correspond to an etch of the portion of the monocrystalline semiconductor of the support layer 104 with a width equal to the sum of the initial width (dimension along axis X) of the trench 128 (that is $D_1$ or $D_2$) and of the dimension $E_2$ shown in FIGS. 25A and 25B. The dimension $E_2$ corresponds to the width b of parts 134 previously described in the first embodiment. In order to have portions of the isolation trench (which will be formed later in the trench 128), the dimension $E_2$ may be between about 5 nm and 10 nm. With such dimension $E_2$, portions 118 of dielectric material with a thickness between about 5 nm and 10 nm will be placed under the active region 110. With such dielectric portions 118 located under the active region 110, the support layer 104 will form an effective ground plane under the active zone 110. Moreover, these dielectric portions 118 will be in contact with the part of the dielectric layer 106 located under the active region 110.

The ratio between dimensions $E_1$ and $E_2$ is linked with the ratio between the etching rate of the crystalline plane {100}, called ER(100), and the etching rate of the crystalline plane {111}, called ER(111). Moreover, the ratio between ER(100) and ER(111) can be adjusted by setting the pressure, the temperature and the duration of the chemical vapor etching. For example, with ER(111)=ER(100), it is possible to obtain a trench 128 in which $E_1$=8 nm and $E_2$=10 nm, or in which $E_1$=4 nm and $E_2$=5 nm. By varying the temperature and/or the pressure and/or the duration of the chemical vapor etching step, it is possible to obtain ER(111)=0.8×ER(100). In this case, it is possible to have $E_1$=$E_2$, for example equal to 10 nm. By varying again the temperature and/or the pressure and/or the duration of this etching step, it is possible to obtain ER(111)=0.58×ER(100). In this case, it is possible to have $E_1$=7.3 nm and $E_2$=5 nm, or $E_1$=13.7 nm and $E_2$=10 nm. With such ratio between ER(100) and ER(111), the angle between crystalline planes {100} and {111} etched in the support layer 104 (referenced 150 in FIGS. 25A and 25B) can be aligned vertically with the side wall of the dielectric thin layer 106 (against which the dielectric layer 116 is formed). Thus, in a preferred embodiment, the ratio ER(111)/ER(100) is equal or greater than about 0.58.

For example, with a temperature of the HCl chemical vapor etching equal to about 850° C., a pressure equal to about 300 Pa and a duration of the etching comprised between about 15 seconds and 30 seconds, it is possible to obtain a ratio ER(111)/ER(100) comprised between about 0.38 and 0.67.

Figure 26A:
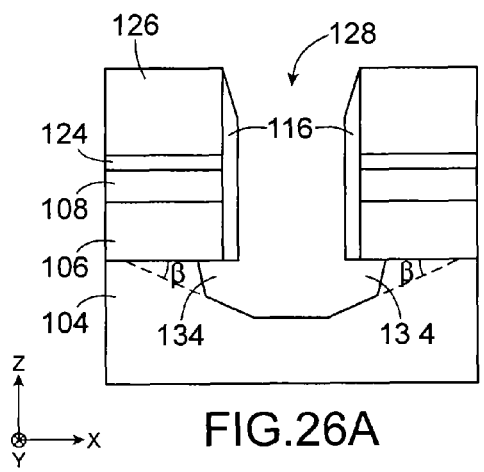
Figure 26B:
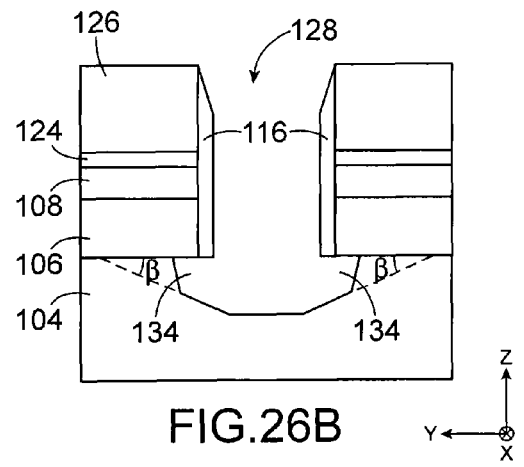
Figure 27A:
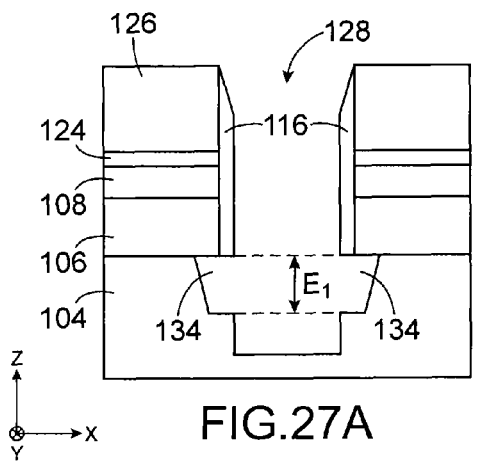
Figure 27B:
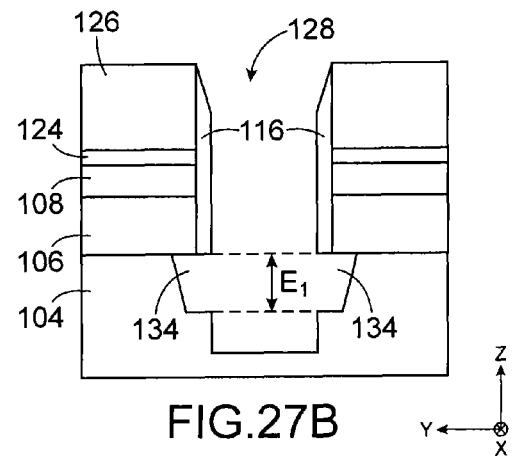

According to a variant shown in FIGS. 26A and 26B, the chemical vapor etching may be carried out at a temperature and at pressure such that this etching step enables to etch the crystalline planes {100} and {111}, but also the crystalline plane {311} of the monocrystalline semiconductor of the support layer 104 which have a crystalline orientation {100}. An angle β between the crystalline plane and the crystalline plane {100} is equal to about 25°. Such variant may be obtained if the temperature is above 850° C. and if the pressure is below 1000 Pa.

As the etching rate of the crystalline plane {100} is linked with the etching rate of the crystalline plane {111} (and eventually with the etching rate of the crystalline plane {311}), it is possible to have a configuration in which the dimension $E_2$ is correct but in which the dimension $E_1$ is not enough. In this case, it is possible to obtain a deeper trench 128 with a further etching of the semiconductor of the support layer 104 at the level of the bottom of the trench 128 (see FIGS. 27A and 27B). Such etching is for example made through at least a part of the support layer 104 with an anisotropic etching step. However, such additional etching of the support layer 104 have the drawback to consume the nitride layer 126 (about 10 nm of the nitride layer 126 is consumed for each 40 nm of etched semiconductor of the layer 104).

The total depth of the trench 128 (through the layers 126, 124, 108, 106 and 104) is for example equal to about 200 nm, and may be between about 100 nm and 300 nm.

The dielectric layer 116 formed along the side walls of the trench 128, at the level of the layers 106, 108, 124 and 126 of the stack, protects these layers, especially the thin silicon layer 108, against the etching agent used during the chemical vapor etching of the support layer 104.

Figure 28A:
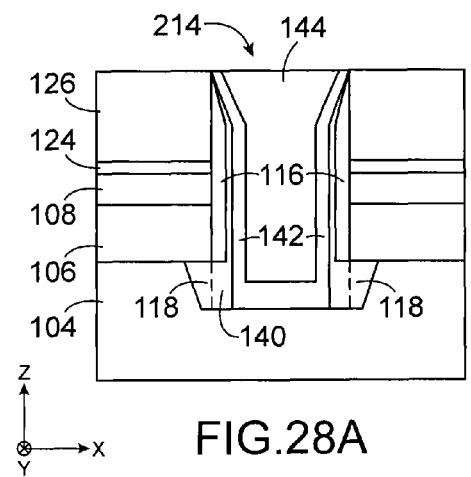
Figure 28B:
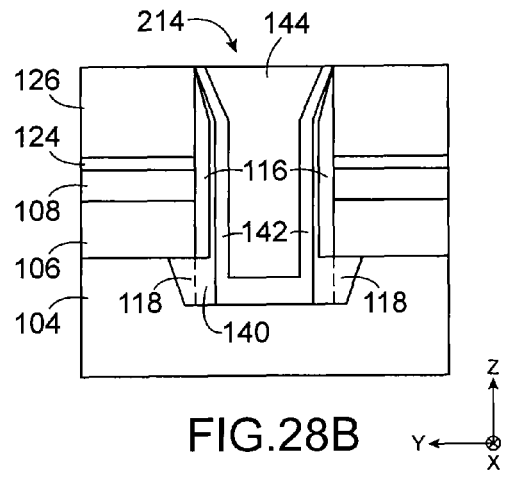

The making of the isolation trench 214 is then achieved with the filling of the trench 128 with the dielectric layers 140, 142 and 144 as previously described with the implementation of the steps previously disclosed in connection with FIGS. 15A to 20B. The isolation trench 214 thus obtained is shown in FIGS. 28A and 28B. Finally, as previously disclosed, the layers 124 and 126 are then removed in order to reveal the thin layer of semiconductor 108. The various components of the device 200 are then made above the thin layer of semiconductor 108 and in the active region 110 (gate dielectric, gate, creation of source and drain regions, etc.).

The invention claimed is:

1. A method of producing a microelectronic device in a substrate comprising a first semiconductor layer disposed on a first dielectric layer, the first dielectric layer being disposed on a second semiconductor layer, the method comprising:

etching the substrate to form a trench through the first semiconductor layer, the first dielectric layer, and a part of the thickness of the second semiconductor layer, the trench defining, in the first semiconductor layer, at least one active region of the microelectronic device, and such that, in the second semiconductor layer, at least one part of the trench extends under a part of the at least one active region;

depositing at least one second dielectric layer against walls of the trench;

etching a part of the at least one second dielectric layer such that at least a part of remaining unetched portions of the at least one second dielectric layer in said at least one part of the trench extending under the part of the at least one active region form portions of a dielectric material extending under the part of the at least one active region; and depositing at least one third dielectric layer in the trench such that the trench is filled with at least dielectric materials of the at least one second dielectric layer and the at least one third dielectric layer, thereby forming an isolation trench surrounding the at least one active region.

2. The method according to claim 1, wherein the thickness of the at least one second dielectric layer is less than a half of a width of the isolation trench.

3. The method according to claim 1, in which the thickness of the at least one second dielectric layer is greater than or equal to a width of said at least one part of the trench extending under the part of the at least one active region.

4. The method according to claim 1, wherein a width of said at least one part of the trench extending under the part of the at least one active region is less than or equal to a half of a width of the isolation trench, or wherein a width of said at least one part of the trench extending under the part of the at least one active region is greater than or equal to a half of a width of the isolation trench and less than or equal to a half of a height of said part of the thickness of the second semiconductor layer.

5. The method according to claim 1, wherein the etching of the part of the at least one second dielectric layer is an anisotropic etching.

6. The method according to claim 1, further comprising, between the etching of the at least one second dielectric layer and the depositing of the at least one third dielectric layer, at least a depositing of a fourth dielectric layer against remaining portions of the at least one second dielectric layer, wherein a thickness of the fourth dielectric layer is less than or equal to a half of a width of the isolation trench, and
wherein the at least one third dielectric layer is deposited over at least the fourth dielectric layer.

7. The method according to claim 1, wherein the dielectric materials of the at least one second dielectric layer and the at least one third dielectric layer comprise at least one semiconductor oxide.

8. The method according to claim 1, wherein portions of the isolation trench that extend under the part of the at least one active region are in contact with parts of the first dielectric layer disposed under the at least one active region.

9. The method according to claim 1, further comprising, between the etching of the substrate and the depositing of the at least one second dielectric layer, producing at least one fifth dielectric layer forming side walls of the trench against the first dielectric layer and the first semiconductor layer, the at least one second dielectric layer being deposited against said at least one fifth dielectric layer.

10. The method according to claim 1, wherein the at least one active region is substantially rectangular in shape and bounded by at least four side walls of the isolation trench extending through the first semiconductor layer, the first dielectric layer, and said part of the thickness of the second semiconductor layer, and wherein, at a level of said part of the second semiconductor layer, two of the four side walls are substantially parallel with respect to each other and comprise the portions of the dielectric material extending under the part of the at least one active region, and the two other side walls do not extend under the at least one active region.

11. The method according to claim 10, further comprising, after the depositing of the at least one third dielectric layer, producing at least one transistor in the at least one active region, the at least one transistor comprising a gate made on the part of the at least one active region and on a part of said two other side walls.

12. The method according to claim 1, wherein the at least one active region is substantially rectangular in shape and bounded by side walls of the isolation trench extending through the first semiconductor layer, the first dielectric layer, and said part of the thickness of the second semiconductor layer, and wherein, at a level of said part of the second semiconductor layer, the side walls extend under the part of the at least one active region.

13. The method according to claim 1, further comprising, after the depositing of the at least one third dielectric layer, producing at least one transistor in the at least one active region, the transistor comprising a gate made on the part of the at least one active region.

14. The method according to claim 1, wherein the isolation trench is filled only with several dielectric layers.

15. The method according to claim 1, wherein said at least one part of the trench that extends under the part of the at least one active region is filled with the at least one second dielectric layer, the rest of the isolation trench being filled with one or more other dielectric layers comprising at least said third dielectric layer.

* * * * *